(12) United States Patent
Vanhee et al.

(10) Patent No.: US 11,313,023 B2
(45) Date of Patent: Apr. 26, 2022

(54) EQUIPMENT FOR COATING A METAL STRIP

(71) Applicant: ArcelorMittal, Luxembourg (LU)

(72) Inventors: Luc Vanhee, Fromelennes (FR); Maxime Monnoyer, Liege (BE); Bruno Schmitz, Nandrin (BE); Benoit Deweer, Sterrebeek (BE); Eric Silberberg, Haltinne (BE)

(73) Assignee: ArcelorMittal, Luxembourg (LU)

( * ) Notice: Subject to any disclaimer, the term of this patent is extended or adjusted under 35 U.S.C. 154(b) by 308 days.

(21) Appl. No.: 16/058,009

(22) Filed: Aug. 8, 2018

(65) Prior Publication Data

US 2019/0040515 A1 Feb. 7, 2019

Related U.S. Application Data

(62) Division of application No. 12/919,304, filed as application No. PCT/FR2009/000181 on Feb. 18, 2009, now Pat. No. 10,072,327.

(30) Foreign Application Priority Data

Feb. 25, 2008 (EP) .................................... 08290173

(51) Int. Cl.
*C23C 8/10* (2006.01)
*C23C 14/14* (2006.01)
*C23C 2/26* (2006.01)
*C23C 14/02* (2006.01)
*C23C 2/06* (2006.01)
(Continued)

(52) U.S. Cl.
CPC .............. *C23C 14/025* (2013.01); *C23C 2/06* (2013.01); *C23C 2/26* (2013.01); *C23C 2/28* (2013.01);
(Continued)

(58) Field of Classification Search
CPC ... C23C 14/025; C23C 14/081; C23C 14/083; C23C 14/16; C23C 14/24; C23C 14/562;
(Continued)

(56) References Cited

U.S. PATENT DOCUMENTS 3,290,184 A 12/1966 Minck
5,648,177 A 7/1997 Fukui et al.
(Continued)

FOREIGN PATENT DOCUMENTS

CN 1542158 A 11/2004
EP 0756022 A2 1/1997
(Continued)

OTHER PUBLICATIONS

International Search Report dated Jul. 28, 2009 in PCT/FR2009/000181.
(Continued)

*Primary Examiner* — Lois L Zheng
(74) *Attorney, Agent, or Firm* — Davidson, Davidson & Kappel, LLC

(57) ABSTRACT

Equipment for manufacturing a metal strip coated by a process that includes vacuum-depositing a layer of an oxidizable metal or an oxidizable metal alloy on a metal strip precoated with zinc or with a zinc alloy, then coiling the coated metal strip, then oxidizing a surface of the metal strip coated with the oxidizable metal or oxidizable metal alloy and treating the oxidized wound coil with a static diffusion treatment to obtain a strip having a coating that includes, in an upper portion, a layer of an alloy formed by diffusion of the oxidizable metal or the oxidizable metal alloy in all or part of the zinc or zinc alloy layer. The equipment includes a device for galvanizing the metal strip, a vacuum deposition coating device, and a static heat treatment device operating in a controlled atmosphere.

22 Claims, 1 Drawing Sheet

(51) Int. Cl.
  *C23C 2/28* (2006.01)
  *C23C 14/16* (2006.01)
  *C23C 14/58* (2006.01)
  *C23C 28/02* (2006.01)

(52) U.S. Cl.
  CPC .......... *C23C 14/16* (2013.01); *C23C 14/5806* (2013.01); *C23C 28/021* (2013.01); *C23C 28/025* (2013.01); *Y02T 50/60* (2013.01)

(58) Field of Classification Search
  CPC ..... C23C 14/584; C23C 14/5846; C23C 2/06; C23C 2/26; C23C 28/00; C23C 28/023; C23C 28/025; C23C 28/32; C23C 28/321; C23C 28/3225; C23C 28/34; B21C 9/005; B21C 43/02; C25D 11/34; C25D 5/48; C25D 3/565
  See application file for complete search history.

(56) References Cited

U.S. PATENT DOCUMENTS

| | | |
|---|---|---|
| 6,939,586 B2 | 9/2005 | Dauchelle et al. |
| 6,994,754 B2 | 2/2006 | Dauchelle et al. |
| 2009/0098295 A1 | 4/2009 | Riemer et al. |
| 2009/0139872 A1 | 6/2009 | Weiher et al. |
| 2010/0003538 A1 | 1/2010 | Nikolov et al. |
| 2013/0061986 A1 | 3/2013 | Vanhee et al. |

FOREIGN PATENT DOCUMENTS

| | | |
|---|---|---|
| EP | 1518941 A1 | 3/2005 |
| EP | 1743956 A2 | 1/2007 |
| EP | 1767670 A1 | 3/2007 |
| JP | H07268604 A | 10/1995 |
| JP | 2000273604 A | 10/2000 |
| RU | 2055916 C1 | 3/1996 |
| UA | 74223 C2 | 11/2005 |
| UA | 74224 C2 | 11/2005 |
| WO | 0214573 A1 | 2/2002 |
| WO | 2006045570 A1 | 5/2006 |
| WO | 2007135092 A1 | 11/2007 |

OTHER PUBLICATIONS

B. Schuhmacher et al. "Novel coating systems based on PVD for steel sheet", Vakuum in Forschung und Praxis, Aug. 1, 2001, pp. 233-234, vol. 13, No. 4.

EQUIPMENT FOR COATING A METAL STRIP

CROSS REFERENCE TO RELATED APPLICATIONS

This is a divisional of U.S. application Ser. No. 12/919,304 filed Oct. 15, 2012, which is the National Stage Entry of PCT/FR2009/000181 filed Feb. 18, 2009, which claims the benefit of EP 08290173.7 filed in the European Patent Office and has a priority date of Feb. 25, 2008, the entire disclosures of which are hereby incorporated by reference herein.

BACKGROUND OF THE INVENTION

The present invention relates to a process for coating a metal strip, more particularly intended for coating steel strip with layers based on zinc and on oxidizable metal elements, without in any way being limited thereto.

Various methods for depositing metal coatings composed of a metal layer, several successive layers of different metals, or metal alloys, on a metal surface such as a steel strip are known. Among these, mention may be made of hot-dip galvanizing, electroplating and various vacuum-deposition processes (evaporation, magnetron sputtering, etc.).

Certain products have to be deposited as several layers, for technological or even economic reasons, and have to undergo a diffusion heat treatment for obtaining the alloy with the desired properties. This may for example be the case for zinc-magnesium coatings that may advantageously replace pure zinc coatings or coatings of other zinc alloys.

The diffusion heat treatment may prove to be complicated and expensive. It may involve the use of large quantities of inerting gas in order to prevent oxidation reactions promoted by the high temperatures during the heat treatment. Furthermore, to avoid any risk of oxidation between the deposition of the oxidizable element and its diffusion treatment, it is necessary to carry out the two operations one immediately after the other, without exposing the strip to the open air.

Furthermore, a continuous heat treatment line runs at speeds incompatible with the time required for the diffusion.

A first solution would consist in producing continuous treatment equipment operating at moderate temperature, the length of the equipment allowing the time necessary for the diffusion to take place, but this equipment is then bulky and expensive and there may not always be enough room to install it on existing production lines. Thus, trials have shown that, for a zinc coating covered with a layer of magnesium with a thickness of 1.5 μm, 50 seconds at 300° C. are required for accomplishing the diffusion, which represents a length of 150 m to be maintained at temperature for a strip running at 180 m/min.

Equipment of such size is not easily acceptable, and, in industrial practice, it is therefore necessary to envisage higher temperatures using shorter continuous treatment equipment. Thus, for a zinc coating covered with a layer of magnesium with a thickness of 1.5 μm, it is possible to limit the diffusion time to around 10 seconds, which represents a length of 30 m to be maintained at temperature for a strip running at 180 m/min. However, the working window for this type of dynamic diffusion treatment is very narrow since, as soon as 350 to 360° C. is reached, the coating melts, passing through a eutectic phase, resulting in the properties of the coating being impaired. Operating the process on high-capacity lines in which the strip runs at 160 to 180 m/min is therefore very tricky. Furthermore, the energies involved are higher and the treatment of certain grades of steel, such as bake-hardening grades, widely used in the automobile industry, is precluded, since their properties would be impaired by such a heat treatment.

Moreover, even by reducing the size of the equipment, the lengths of treatment to be carried out still remain such that the continuous treatment equipment must provide strip support rollers or strip deflectors, which are complicated and expensive, since they have to be cooled and designed so as not to degrade the layer formed, something which may in particular happen when a strip sticks on the rollers.

SUMMARY OF THE INVENTION

The present invention provides a process for manufacturing a metal strip covered with a coating based on zinc or on a zinc alloy and an oxidizable metal or an oxidizable metal alloy, which consumes little energy and little or no inerting gas, which is easy to implement, which is compact and which allows metal substrates of various type to be treated.

For this purpose, a first object of the present invention is a process for coating a metal strip, in which a layer of an oxidizable metal or an oxidizable metal alloy is vacuum-deposited on a metal strip precoated with zinc or with a zinc alloy, the coated metal strip is then coiled, and the wound coil undergoes a static diffusion treatment so as to obtain a strip having a coating that comprises, in the upper portion, a layer of an alloy formed by diffusion of the oxidizable metal or the oxidizable metal alloy in all or part of the zinc or zinc alloy layer.

The process according to the invention may also comprise various optional features, taken individually or in combination:
  the coating comprises only a layer of an alloy formed by diffusion of the oxidizable metal or the oxidizable metal alloy throughout the zinc or zinc alloy layer;
  the coating comprises a lower portion, consisting of zinc or a zinc alloy, and an upper portion consisting of a layer of an alloy formed by diffusion of the oxidizable metal or the oxidizable metal alloy into a portion of the zinc or zinc alloy layer;
  the metal strip has been precoated with zinc or a zinc alloy by a hot-dip galvanizing process;
  the metal strip has been precoated with zinc or a zinc alloy by an electroplating process;
  the metal strip has been precoated with zinc or a zinc alloy by a vacuum deposition process;
  the metal strip is precoated with a zinc or zinc alloy layer having a thickness of between 0.5 and 15 μm, preferably between 0.5 and 7.5 μm and more particularly preferably between 0.5 and 5 μm;
  the zinc or zinc alloy coated metal strip is coated with magnesium or a magnesium alloy by vacuum deposition;
  a magnesium layer is deposited by vacuum evaporation with a thickness of between 0.2 and 5 μm, preferably between 0.2 and 2 μm;
  a layer of an alloy with the composition $Zn_2Mg$, possibly comprising $Zn_{11}Mg_2$ compounds, is formed during the static diffusion annealing;
  the coating on the metal strip coated with the oxidizable metal or metal alloy is oxidized on the surface before undergoing said static diffusion treatment;
  the coil of metal strip is heated for a time of between 4 and 40 hours at a temperature below 200° C.;

the metal strip is a steel strip and may be made of a bake-hardening steel.

A second object of the invention is formed by equipment for implementing the process according to the invention, comprising:

a device for galvanizing said metal strip; followed by
a vacuum deposition coating device; and
a static heat treatment device operating in a controlled atmosphere.

The equipment according to the invention may also comprise the following variants, taken individually or in combination:

the galvanizing device is a hot-dip galvanizing device;
the galvanizing device is an electrogalvanizing device;
the galvanizing device is a vacuum deposition galvanizing device.

DETAILED DESCRIPTION

Figure 1:
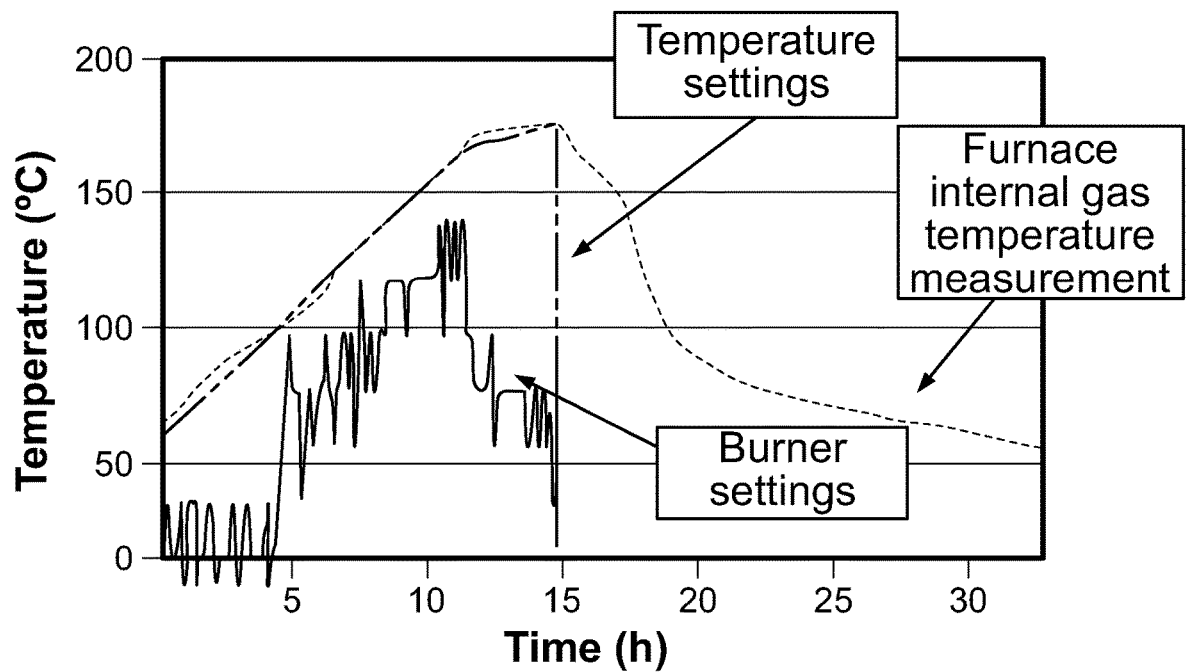
FIG. 1 shows an actual thermal cycle for the treatment of a steel coil weighing 2 tons, according to the present invention.

Other features and advantages of the invention will become apparent on reading the following description, given solely by way of example.

The process according to the invention applies more particularly, but not solely, to the treatment of steel strip coated with zinc or with a zinc alloy. The term "zinc alloy" denotes any compound comprising at least 50% zinc and possibly containing, for example, aluminum, iron, silicon, etc.

The coated strip may be obtained by any galvanizing process, whether hot-dip galvanizing, electroplating or vacuum evaporation deposition, for example. However, strip coated by electroplating or by vacuum evaporation deposition is preferred in which the coating thickness is constant over the entire surface of the steel coil.

The thickness of the coating will preferably be between 0.5 and 15 µm. This is because below 0.5 µm, there is a risk that the corrosion protection of the strip is insufficient. The thickness of the coating may be up to 15 µm, depending on the end applications of the strip, but in general it is less than 7.5 µm as it is unnecessary to go beyond this to have the level of corrosion resistance required in particular in the automobile industry.

Of course, the process according to the invention may be used with any coated metal substrate not liable to have its properties irreversibly impaired during the subsequent heat treatment. Thus, the process according to the invention may especially be applied to bake-hardening steel strip containing large amounts of carbon in solid solution, which must not be completely precipitated before the strip undergoes a forming operation, by stamping or any other suitable process. The heat treatment according to the invention, despite the low temperature levels thereof, will precipitate a small portion of the carbon in solid solution present in these grades, but a surface work hardening (skin-pass) treatment after diffusion will restore the properties of these grades, something which would not be possible with the processes of the prior art. By carrying out the static annealing cycle at low temperature it is thus possible to make the heat treatment compatible with most metallurgies.

The zinc or zinc alloy coated metal strip is firstly coated with a layer of an oxidizable metal or an oxidizable alloy by a vacuum deposition process. Mention may especially be made of magnetron sputtering, cold plasma deposition and vacuum evaporation processes, without the invention being any way limited thereto.

The use of such a process makes it possible in particular to deposit a very thin layer of oxidizable metal or metal alloy, preferably with a thickness of between 0.2 and 5 µm. Furthermore, such a coating process allows this additional layer to be deposited without heating the strip and therefore without subjecting it to any inopportune diffusion between the substrate and the zinc layer.

The deposition of the oxidizable metal or metal alloy is conventionally carried out starting with a metal coil, which is unwound before running it through the deposition chamber. The strip runs through this chamber, in which the coating is deposited, then exits the chamber and is coiled, again conventionally.

The oxidizable metal may in particular consist of magnesium, which has the advantage of greatly enhancing the corrosion resistance of a metal strip when it is added to the zinc in the surface coating of this metal strip. In most applications, the magnesium thickness may be limited to 2 µm owing to this considerable improvement in corrosion resistance.

After this deposition step, the metal strip is therefore covered with a zinc or zinc alloy layer above which is a layer of oxidizable metal or alloy. Since the strip is coiled and then stored without it being inerted, the outermost surface of said strip rapidly oxidizes on contact with oxygen in the air, thus forming an oxidation layer.

The present inventors then attempted to carry out a static annealing operation on the non-unwound metal coil, which made it possible for the oxidizable element to diffuse completely correctly into the upper portion of the zinc or zinc alloy layer. Quite surprisingly, the oxidation layer in no way impeded this diffusion, contrary to what a person skilled in the art might have expected.

Furthermore, this very oxidation layer proved to be propitious in preventing the turns of the coil from sticking together during the diffusion heat treatment.

Of course, it is still possible to protect the metal strip from oxidation during transportation and storage between the coating operation and the heat treatment by depositing a final protection layer. However, the laboratory trials carried out have shown that this protection is unnecessary.

The static annealing is carried out in conventional box annealing equipment in an atmosphere which may be an oxidizing or a nonoxidizing atmosphere.

In particular, the present inventors have shown that the annealing treatment in an oxidizing atmosphere, such as air, prevents certain heterogeneities in surface color of the strip from appearing.

As in the case of the metallurgical annealing of an uncoated metal coil, the rates of temperature rise and fall must be adapted according to the temperature heterogeneities accepted within the metal coil. The other characteristics of the heat cycles to be carried out, such as the time during which the temperature rises, the soak time and the duration of cooling, are also determined according to the desired maximum temperature level. Thus, FIG. 1 shows an example of an actual thermal cycle for the treatment of a steel coil weighing 2 tons. This figure indicates the temperature settings and the control of the burners for a static heat treatment device. It may be seen that the temperature rise is accomplished over 14 hours, until 170° C. is reached, after which the heating is stopped and the coil gradually cooled down to 55° C. after a total treatment time of 30 hours.

Since the duration of this type of annealing ranges generally from 4 to 40 hours, the maximum temperatures reached will generally be below 200° C. This makes it possible to treat a large number of steel or metal grades that are sensitive to an excessively high temperature rise and that could not undergo continuous annealing. This is because, owing to the high run speed during a continuous annealing operation, the hold temperature would be much higher.

Static diffusion cycles were carried out at various temperatures and with various levels of tightening between turns. These various levels of tightening have shown that, well beyond the normal range of winding stresses and well beyond the normal range of pressures undergone during heat treatments on coils, there was no sticking between turns.

The sheets resulting from these static diffusion heat treatments reveal correctly diffused products and the formation of the intended alloy at the surface of the coating, with either complete or partial diffusion depending on the case.

EXEMPLARY EMBODIMENTS

Example 1

A 15-tonne coil of bake-hardening steel strip coated with a 2.5 µm layer of zinc by electroplating was then coated with a 1 µm layer of magnesium by vacuum evaporation. The strip then spent several days in the open air with no particular protection, resulting in the formation of a magnesium oxide layer on the outermost surface.

The metal strip was then subjected to a static annealing treatment at 160° C. to make the magnesium diffuse into the zinc.

The inerting gas used during the static annealing was a nitrogen/hydrogen mixture, identical to that used conventionally for annealing low carbon steel. No oxidation of the metal coil was observed during the heat treatment because a nonoxidizing inerting gas was used.

Figure 2:
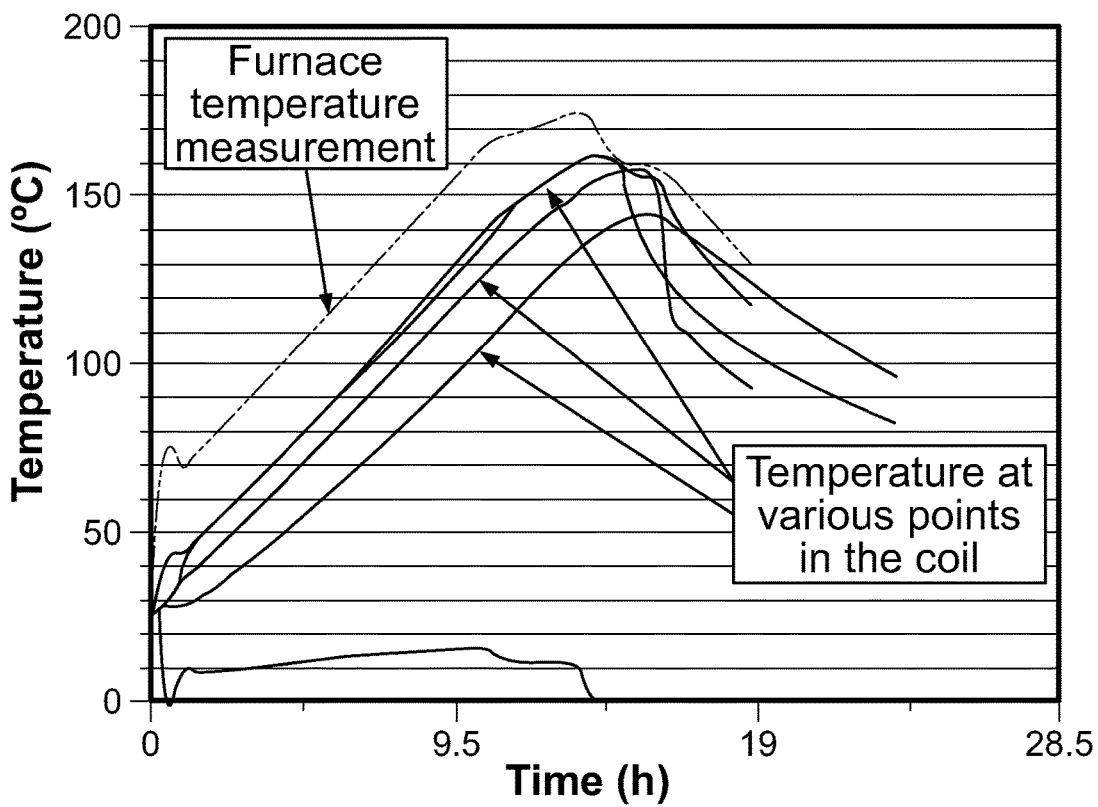
FIG. 2 shows a thermal cycle undergone by a coated coil of bake-hardening steel strip, according to the present invention.

FIG. 2 shows the thermal cycle undergone by the coil. This figure also shows the variation in the temperature of the gas inside the furnace, the variations in temperature of the various points in the steel coil, including in particular the hottest point and the coolest point.

It may be seen that the temperature rise is carried out over a period of approximately 14 hours. The hold at the 160° C. soak temperature lasted about 2 hours, during which the magnesium diffusion took place. In practice, such a soak hold is obtained by simply turning the furnace off and leaving the coil therein. The cooling down to a temperature of 70° C. lasted about 8 hours. Thus, the total cycle time was about 24 hours. To start the cooling, the coil was removed from the furnace and placed under a cooling bell, enabling these cooling conditions to be controlled.

Thus, all of the magnesium was alloyed with a portion of the zinc forming the first layer, and a coating having a zinc sublayer and a Zn—Mg alloy upper layer was obtained. The differences in temperature between the hottest point of the coil and the coolest point of the coil represent a difference in diffusion rate limited to a few percent, resulting in no significant modifications to the properties of the coating. It is also possible to adapt the temperature soak time before cooling so as to allow this diffusion rate to be made completely uniform, should this prove necessary.

Example 2

In the same way as in example 1, two 15-tonne coils A and B of bake-hardening steel strip identical to that used above, these being coated with a 2.5 µm layer of zinc by electroplating, were then coated with a 1 µm layer of magnesium by vacuum evaporation. Each strip was then left in the open air without any particular protection, causing the formation of a magnesium oxide layer of the outermost surface.

Each metal strip was then subjected one after another to a static annealing treatment at 160° C. in the same static annealing equipment, to make the magnesium diffuse into the zinc. The thermal cycle undergone by the coils was the same as in example 1, the only treatment difference being the type of atmosphere chosen for annealing coil B.

Coil A:

The gas used during the static annealing of coil A was an inert nitrogen/hydrogen mixture identical to that mentioned in example 1. The same effects as regards oxidation of the metal coil during the heat treatment could be observed.

In addition, whereas in example 1 the color of the metal strip after the static annealing treatment was a uniform light gray, in this case darker halos appeared on the edges of the strip. The color along the axis of the strip remained unchanged relative to that observed in example 1. Electron microscope observations showed that, in the light zone, the magnesium crystallites present on the surface of the strip had very sharp and well-defined hexagonal geometric shapes. In contrast, in the dark zones, the magnesium crystallites present on the surface of the strip were deformed and had irregular edges.

Complementary investigations did not reveal any appreciable difference from a chemical standpoint between the light zone and the dark zones.

This slight color heterogeneity is therefore very probably due to the deformation of the magnesium crystallites on the surface of the strip in the dark zones: these crystallites scatter light differently and produce the observed visual effect.

Since all the parameters in the study (steel strip, zinc and magnesium coatings, thermal characteristics and atmosphere of the annealing) had been left unchanged in relation to those of example 1, the cause of the crystallite deformation proves to be due to the annealing equipment itself. Specifically, depending on the production campaigns in progress, the equipment may contain variable amounts of polluting species, such as for example carbon residues coming from rolling oil combustion. In addition, the shape of the coloration defect, in the form of an oscillation starting from the edges, leaves one to suppose that there is an effect caused by the inter-turn diffusion of gaseous species contained in the annealing atmosphere. Thus, the presence of polluting agents in the annealing atmosphere, combined with a thermal gradient effect, transverse to the strip, could explain the observed phenomenon.

Coil B:

The gas used during the static annealing of coil B was air. The observed effects as regards oxidation of the metal coil during the heat treatment were the same as those observed in the case of coil A and in example 1.

However, in this case, the coloration defect did not appear. The strip had a uniform light gray color, identical to that observed in example 1. Moreover, electron microscope observations showed that the magnesium crystallites present on the surface of the strip had very sharp and well-defined hexagonal geometric shapes, as in the light zone of coil A.

Since coils A and B were treated one after the other in the same annealing equipment, the sole unique element of the latter experiment was the annealing atmosphere, all the other parameters remaining unchanged (steel strip, zinc and magnesium coatings, thermal characteristics of the annealing). The fact that the heat treatment was carried out in air therefore had the effect of neutralizing the thermochemical effects responsible for the appearance of the coloration defect observed on coil A (elimination of the pollutants, etc.).

It has thus been shown that, in the case of a diffusion heat treatment on industrial equipment, the fact of using an oxidizing gas such as air instead of an inert gas annealing atmosphere makes it possible to neutralize the thermochemical effects due to the presence of pollutants (arising for example from the previous uses of the equipment) and possibly leading to the appearance of a coloration defect on the final product. It is therefore possible in particular to carry out the process according to the invention without inerting.

The invention makes it possible to produce coatings comprising alloys by depositing multilayers, without having to invest in a complicated and expensive on-the-run diffusion device. The space required in the coating line is therefore around 50% less than for equipment for carrying out the annealing in line. The invention is therefore particularly suitable for new products to be applied on an existing production line when the production volume is small or when the start-up curve is long and slow.

The invention uses a static heat treatment of longer time and at lower temperature than has to be applied on a continuous line. The invention allows compact tools to be used to carry out the diffusion. It minimizes, or even eliminates, the consumption of inerting gas and minimizes the energy consumption per ton (and the power to be installed) by lowering the temperature of the diffusion cycle, thereby making the treatment compatible with a wide range of steel products and steel grades.

The invention allows the use of box annealing equipment or similar production tools to carry out the alloying necessary for producing the end product. By using existing box annealing tools it is possible to reduce the investment cost by around 30% (taken over an investment including the deposition and the heat treatment) and thus to decide to invest in, and launch on the market, new products of shorter life time or lower cumulative volume.

By combining processes, it is possible to produce innovative multilayer coatings. Combined with a diffusion heat treatment, these may give rise to an alloy giving the coated product advantageous surface characteristics.

It is then necessary either to construct a new production plant or to supplement an existing production plant. The second case is more opportune provided that it combines, in the alloy, a metal already deposited using the existing equipment and provided that the equipment is available, in terms of space and capacity, for providing the new production.

The present invention is aimed in particular at obtaining zinc-magnesium coatings, but it is not limited to these coatings—it encompasses any coating based on an oxidizable metal or oxidizable alloy.

What is claimed is:

1. Equipment for manufacturing a metal strip coated by a process for coating a metal strip, the process comprising the steps of:
    vacuum-depositing a layer of an oxidizable metal or an oxidizable metal alloy on a metal strip precoated with zinc or with a zinc alloy;
    coiling the coated metal strip; then
    oxidizing a surface of the metal strip coated with the oxidizable metal or oxidizable metal alloy; and
    treating the oxidized wound coil with a static diffusion treatment so as to obtain a strip having a coating that comprises, in an upper portion, a layer of an alloy formed by diffusion of the oxidizable metal or the oxidizable metal alloy in all or part of the zinc or zinc alloy layer,
    the equipment comprising:
    a device for galvanizing the metal strip;
    a vacuum deposition coating device; and
    a static heat treatment device operating in a controlled atmosphere, the static heat treatment device comprising box annealing equipment.

2. The equipment as recited in claim 1, wherein the galvanizing device is a hot-dip galvanizing device.

3. The equipment as recited in claim 1, wherein the galvanizing device is an electrogalvanizing device.

4. The equipment as recited in claim 1, wherein the galvanizing device is a vacuum deposition galvanizing device.

5. The equipment as recited in claim 1, wherein a duration of the static diffusion treatment ranges from 4 to 40 hours and a maximum temperature of the static diffusion treatment is less than 200° C.

6. The equipment as recited in claim 1, wherein a duration of the static diffusion treatment is at least 4 hours.

7. The equipment as recited in claim 1, wherein the static heat treatment device includes a furnace holding the oxidized wound coil.

8. The equipment as recited in claim 1, wherein the static heat treatment device includes an inert nitrogen/hydrogen mixture defining the controlled atmosphere.

9. The equipment as recited in claim 1, wherein the static heat treatment device includes a furnace capable of holding the oxidized wound coil with a weight of 15 tonnes.

10. The equipment as recited in claim 1, wherein the controlled atmosphere is oxidizing atmosphere.

11. Equipment for manufacturing a metal strip coated by a process for coating a metal strip, comprising:
    a device for galvanizing a metal strip;
    a vacuum deposition coating device for vacuum-depositing a layer of an oxidizable metal or an oxidizable metal alloy on a metal strip precoated with zinc or with a zinc alloy;
    a coiling device for coiling the metal strip;
    an atmosphere for oxidizing a surface of the metal strip coated with the oxidizable metal or oxidizable metal alloy; and
    a static heat treatment device operating in a controlled atmosphere for treating the oxidized wound coil with a static diffusion treatment so as to obtain a strip having a coating that comprises, in an upper portion, a layer of an alloy formed by diffusion of the oxidizable metal or the oxidizable metal alloy in all or part of the zinc or zinc alloy layer, the static heat treatment device comprising box annealing equipment.

12. The equipment as recited in claim 11, wherein the galvanizing device is a hot-dip galvanizing device.

13. The equipment as recited in claim 11, wherein the galvanizing device is an electrogalvanizing device.

14. The equipment as recited in claim 11, wherein the galvanizing device is a vacuum deposition galvanizing device.

15. The equipment as recited in claim 11, wherein the coiling device is upstream of the atmosphere oxidizing the surface of the metal strip.

16. The equipment as recited in claim 11, wherein the static heat treatment device is downstream of the atmosphere oxidizing the surface of the metal strip.

17. The equipment as recited in claim 11, wherein the galvanizing device is upstream of the vacuum deposition coating device.

18. The equipment as recited in claim 11, wherein a duration of the static diffusion treatment ranges from 4 to 40 hours and a maximum temperature of the static diffusion treatment is less than 200° C.

19. The equipment as recited in claim 11, wherein a duration of the static diffusion treatment is at least 4 hours.

20. The equipment as recited in claim 11, wherein the static heat treatment device includes a furnace holding the oxidized wound coil.

21. The equipment as recited in claim 11, wherein the static heat treatment device includes an inert nitrogen/hydrogen mixture defining the controlled atmosphere.

22. The equipment as recited in claim 11, wherein the controlled atmosphere is oxidizing atmosphere.

* * * * *